Oct. 31, 1961 F. R. STEEL 3,007,118

MODULATED OSCILLATOR

Filed April 11, 1957

INVENTOR.
Francis R. Steel

BY Mueller & Aichele

ATTYS.

3,007,118
Patented Oct. 31, 1961

3,007,118

MODULATED OSCILLATOR

Francis R. Steel, Wilmette, Ill., assignor to Motorola, Inc., Chicago, Ill., a corporation of Illinois Filed Apr. 11, 1957, Ser. No. 652,257
3 Claims. (Cl. 332—29)

This invention relates generally to crystal-controlled oscillators, and more particularly to a crystal-controlled oscillator, the frequency of which may be varied in response to control signals to provide frequency modulation or frequency control.

Crystal-controlled oscillators are used for radio transmitters and receivers. In the crystal-controlled oscillators used in frequency modulated transmitters, the crystals hold the center frequency of the transmitted wave on the frequencies which are defined by the Federal Communications Commission. The frequency of the wave must then be varied from this center frequency to transmit information. In radio receivers, the local oscillator may be varied to provide precise tuning to the desired frequency. It has been proposed to provide crystal controlled oscillators with a series resonant circuit in series with the crystal, and with the inductance of the resonant circuit being a saturable reactor. Modulating or control signals may be applied to the saturable reactor to effect frequency modulation in the case of the oscillator of a transmitter, or to tune the local oscillator to provide automatic frequency control in the case of a superheterodyne receiver. However, such circuits have required relatively large saturable reactors and there has also been difficulty in matching impedances in the circuits in which such saturable reactors are used. It has also been difficult to obtain adequate stability of center frequency simultaneously with sufficient frequency deviation.

It is, accordingly, an object of the invention to provide a new and improved directly modulated crystal oscillator.

Another object of the invention is to provide an improved circuit for coupling a saturable reactor in a directly modulated crystal oscillator.

A further object of the invention is to provide a circuit which allows a small, compact saturable reactor unit to be used in a directly modulated crystal oscillator circuit.

One feature of the invention is the provision of a directly modulated crystal-controlled oscillator having a series resonant circuit including a modulating saturable reactor coupled by a transformer to the frequency controlling circuit of the oscillator.

Another feature of the invention is the provision of a directly modulated crystal-controlled oscillator having a series resonant circuit in which a portion of the inductance is a saturable reactor having an inductive winding provided on a saturable core, with various circuits having further inductance in series with a crystal being selectively connected in the series resonant circuit so that the saturable reactor controls the series resonant circuit at different frequencies defined by the selectively connected inductance and crystal.

A further feature of the invention is the provision of a saturable reactor having permanent magnetic bias and two control windings or one center-tapped control winding so that the reactor may be controlled by an amplifier having a push-pull output.

Figures 1, 2, 3, 4:
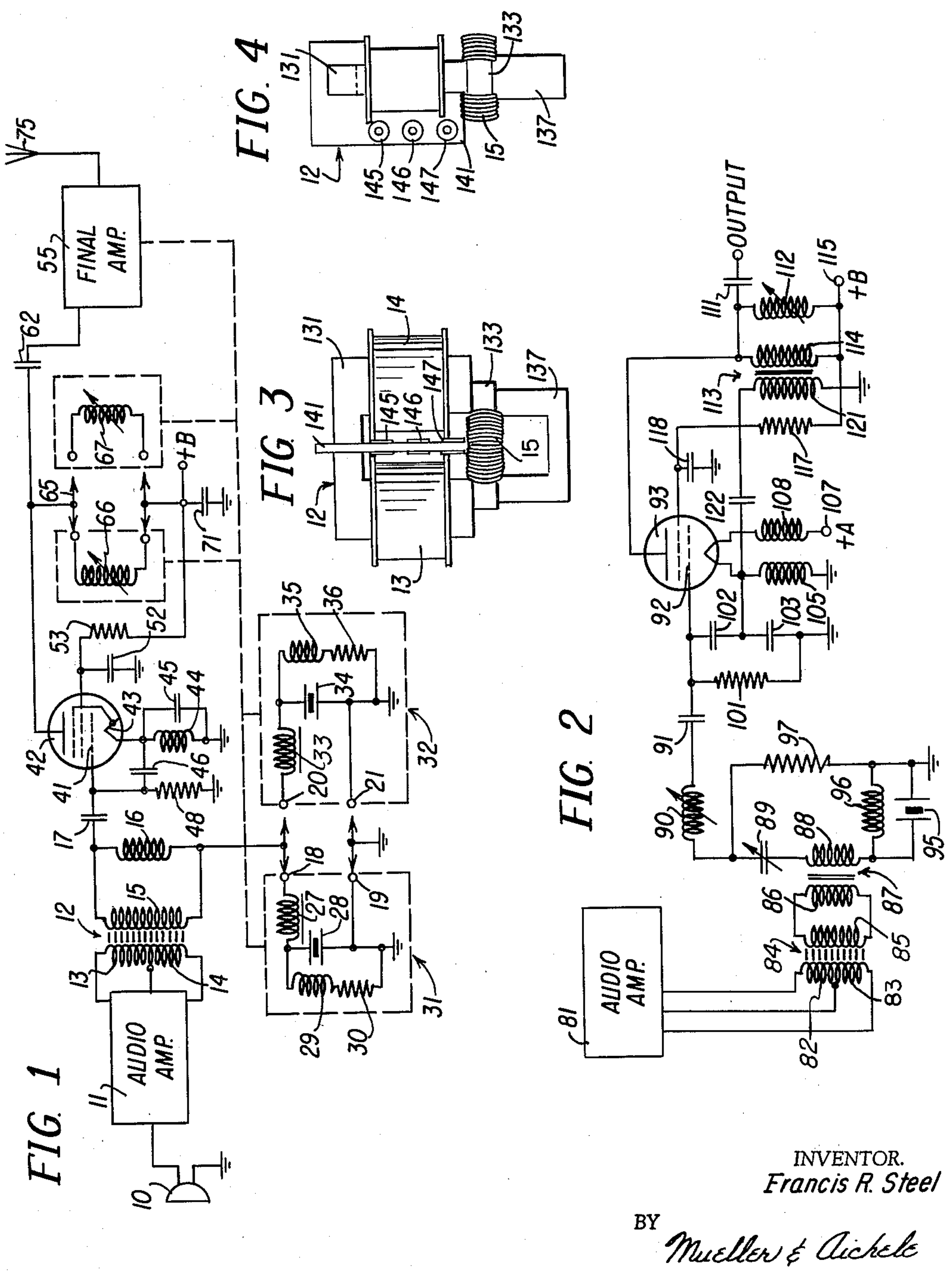
FIG. 1 shows a circuit of a directly modulated oscillator forming one embodiment of the invention.
FIG. 2 shows a directly modulated oscillator forming another embodiment of the invention.
FIG. 3 is an elevation of a saturable reactor for modulating the frequency of the circuits shown in FIGS. 1 and 2.
FIG. 4 is a side elevation of the reactor shown in FIG. 3.

The invention provides a crystal controlled oscillator circuit including a saturable reactor for modulating or controlling the frequency of the oscillator circuit. The reactor includes a pair of input windings, having connections for a push-pull amplifier output, mounted on the arms of a U-shaped laminated iron core, and an inductive coil on a toroidal core forming the output of the reactor bridging the arms of the laminated iron core. The toroidal core also bridges the arms of a U-shaped permanent magnet serving to bias the core. The coil may be connected directly in series with a capacitance to form a series resonant circuit connected in series with the crystal in the frequency controlling circuit of the oscillator. The series resonant circuit is resonant substantially at the series resonant frequency of the crystal. A plurality of crystal circuits may be provided each including an inductor, and a crystal adapted to be selectively connected into the oscillator circuit in series with the saturable reactor inductive coil to provide different frequencies of oscillation. The oscillator may also have tuned output circuit in which a plurality of inductors may also be ganged with the crystal circuits and switched selectively into and out of the oscillator circuit as the frequency thereof is changed. In another embodiment of the invention, saturable reactor is connected in the series resonant circuit through a transformer so that less inductance is required and a smaller saturable reactor structure may be used.

In FIG. 1 there is shown a frequency modulation transmitter circuit operable to transmit at two different selected center frequencies. The transmitter includes a microphone 10 applying its output to an audio amplifier 11 having the signal winding of a saturable reactor 12 in the output thereof. The amplifier 11 has a final push-pull output stage and the reactor has signal winding sections 13 and 14, which form, in effect, a center tapped primary winding. The reactor 12 also includes an inductive or output winding 15, which is shunted by choke coil 16 and connected in series with a switch to which may be selectively connected terminals 18 and 19 or terminals 20 and 21 of the oscillator control circuits 31 and 32 respectively. The terminal 18 is connected to a coil 27 connected in turn to a frequency controlling crystal 28 grounded at the other side thereof. An inductor 29 and a resistor 30 are connected in series with one another and in shunt with the crystal 28. The elements 27, 28, 29, and 30 form the frequency control unit 31. A second frequency control unit 32, includes coil 33, crystal 34, inductor 35 and resistor 36. The inductive winding or coil 15 and the choke coil 16 are connected in parallel, and are connected in series with capacitor 17 and coil 27 (or 33) and form a series resonant network. This series resonant network is tuned substantially to the series resonant frequency of the crystal 28. The capacitor 17 is connected to the control grid 41 of a pentode vacuum tube 42 which includes a cathode 43 connected by inductor 44 and capacitor 45 in parallel to ground. A bias resistor 48 connects the grid 41 to ground and capacitor 46 couples the grid 41 to the cathode 43. A B+ potential is applied to the screen grid through resistor 53, the screen potential being bypassed by capacitor 52. The plate of the tube 42 is coupled to a B+ supply through output tuning inductor 66 (or 67), the variable inductors 66 and 67 being selectively connected by switch 65 and ganged- tuned with the units 31 and 32. The modulated oscillator output is coupled through capacitor 62 to the final amplifier 55. A transmitting antenna 75 is supplied with the frequency modulated signal from the final amplifier 55.

Feedback for the oscillator is provided by the interelectrode capacitance of the tube 42. The center frequency of the oscillator is determined by the frequency determining unit 31 or 32 and the inductor 66 or 67 which are connected. Assuming that the unit 31 is connected, with no signal into the microphone 10 the inductance of the output winding of the saturable reactor 12 is constant and the oscillator oscillates at a fixed frequency determined by the crystal 28. The inductor 29 and the resistor 30 shunt the crystal 28 to neutralize it. The coil 27, winding 15, and coil 16 form the inductance of the series resonant circuit which also includes the capacitor 17. However, when audio signals are introduced to the audio amplifier from the microphone 10, the signals are amplified by the amplifier 10 and supplied to the center-tapped winding halves 13 and 14. This changes the inductance of the winding 15, thereby changing the inductance of the series resonant circuit and changing the natural resonant frequency thereof. This causes the oscillator frequency to shift, with the shift being on opposite sides of the center frequency as the inductance of winding 15 increases or decreases. The modulated output of the oscillator is supplied to the final amplifier 55 and to the transmitting antenna 75 from the final amplifier 55.

The following circuit constants for the circuit of FIG. 1 are given merely by way of illustration, and are not intended to limit the scope of the invention in any way:

| | |
|---|---|
| Inductor 13 | 20 millihenries. |
| Inductor 14 | 20 millihenries. |
| Inductor 15 | 4 to 15 microhenries. |
| Inductor 16 | 20 microhenries. |
| Capacitor 17 | 27 micromicrofarads. |
| Inductor 27 | 11 microhenries. |
| Crystal 28 | 12.5 megacycles per second. |
| Inductor 29 | 15 microhenries. |
| Resistor 30 | 220 ohms. |
| Inductor 33 | 6 microhenries. |
| Crystal 34 | 15 megacycles per second. |
| Inductor 35 | 15 microhenries. |
| Resistor 36 | 220 ohms. |
| Tube 42 | Type 6612. |
| Inductor 44 | 50 microhenries. |
| Capacitor 45 | 22 micromicrofarads. |
| Capacitor 46 | 12 micromicrofarads. |
| Resistor 48 | 470 kilohms. |
| Capacitor 52 | 1,000 micromicrofarads. |
| Resistor 53 | 10 kilohms. |
| Capacitor 62 | 22 micromicrofarads. |
| Inductor 66 | 4.0 microhenries. |
| Inductor 67 | 1.25 microhenries. |
| Capacitor 71 | .01 microfarad. |

In the circuit shown in FIG. 2, modulating signals are fed to an audio amplifier 81 having a push-pull output driving equal turn input windings 82 and 83 saturable core reactor 84 having a variable inductance winding 85. The winding 85 is connected to the primary winding 86 of a transformer 87 having a secondary winding 88 forming a portion of the inductance of a series resonant circuit. The series resonant circuit also includes capacitor 89, inductor 90 and a capacitor 91 coupling the series resonant circuit to a control grid 92 of tube 93 of the oscillator. The series resonant circuit is connected in series with a frequency-controlling crystal 95. Inductor 96, connected in parallel with the crystal, and a resistor 97 form a neutralizing circuit for the crystal 95. A grid bias resistor 101 connects the control grid 92 to ground and capacitors 102 and 103 form a voltage-divider, the junction point of which is connected to the cathode of the tube 93. The cathode is directly heated and is energized from filament voltage supply 107 through bifilar coils 105 and 108.

The plate circuit of the tube 93 includes a coupling output capacitor 111, and a choke coil 112 and a transformer winding 114 connected in parallel to the B+ terminal 115. B+ potential is applied to the screen grid of the tube 93 through resistor 117, and the screen grid of the tube 93 is by-passed to ground by capacitor 118. A transformer winding 121 of the transformer 113 is coupled by capacitor 122 to the cathode of tube 93, and provides feed-back to the input circuit of the oscillator. Modulating signals coming from the amplifier 81 to the saturable reactor 12 changes the inductance of winding 15 thereof and this in turn varies the inductance of the secondary winding 88 of transformer 87 which is in the series-resonant circuit. This varies the frequency of the tuned oscillator circuit so that the crystal frequency in effect shifts from side to side of the center frequency.

The following circuit constants apply to FIG. 2 and are given merely by way of illustration and are not intended to limit the scope of the invention in any way:

| | |
|---|---|
| Inductor 82 | 10 millihenries. |
| Inductor 83 | 10 millihenries. |
| Inductor 85 | 0.5 to 2 microhenries. |
| Inductor 86 | 5 microhenries. |
| Inductor 88 | 30 microhenries. |
| Capacitor 89 | 18 micromicrofarads. |
| Inductor 90 | 9 microhenries. |
| Capacitor 91 | 47 micromicrofarads. |
| Crystal 95 | 15 megacycles per second. |
| Inductor 96 | 15 microhenries. |
| Resistor 97 | 1,000 ohms. |
| Resistor 101 | 470 kilohms. |
| Capacitor 102 | 12 micromicrofarads. |
| Capacitor 103 | 22 micromicrofarads. |
| Inductor 105 | 50 microhenries. |
| Inductor 108 | 50 microhenries. |
| Capacitor 111 | 47 micromicrofarads. |
| Inductor 112 | 1.25 microhenries. |
| Inductor 114 | 10 microhenries. |
| Resistor 117 | 10 kilohms. |
| Capacitor 118 | 1,000 micromicrofarads. |
| Inductor 121 | 10 microhenries. |
| Capacitor 122 | 1 micromicrofarad. |

The saturable reactor structure is shown in FIGS. 3 and 4. The unit includes a laminated iron core 131 of U-shape and having spool-wound signal windings 13 and 14 mounted on the arms of the core 131. Bridging the core 131 and disposed transversely relative to the arms of the core 131 is a toroidal core 133 having the winding 15 distributed on the portions thereof not in contact with the arms of the core 131. The halves of the winding 15 on the core 133 are in series-aiding relation and have one common center lead and two end leads. A permanent magnet 137 also of U-shape is mounted in alignment with the core 131, with its arms engaging the toroidal core 133 to bias the core 133 to a predetermined degree of saturation. An insulating, non-magnetic mounting panel 141 is secured to the core 131 and to the toroidal core 133 and has terminals 145, 146, and 147 to which the ends of the audio input leads of the coils 13 and 14 are connected. The adjacent ends of the leads of the coils 13 and 14 are connected together and to the third terminal. The permanent magnet 137 is held to the core 133 by thermosetting cement and the panel 141, and the entire assembly may be encapsulated in an insulating compound or otherwise mounted as desired.

The oscillators described above have been described in particular as providing a frequency-modulated output in response to the application of modulating signals thereto, but may also be used to provide slowly varying controls of crystal-controlled oscillators. For example, instead of applying audio modulated signals to the systems of FIGS. 1 and 2, a slowly varying direct current may be applied to adjust the output frequency of the oscillators.

The oscillators made in accordance with the invention have been found to provide wide deviations of the frequency of the oscillators so that the necessary deviations of the signal transmission can be produced without a large number of multiplier stages. Also, a separate modulator stage is not required. The saturable reactors are small and compact providing an inexpensive yet effective unit. The transformer coupling of the saturable reactors shown in FIG. 2 permits the use of a much smaller saturable reactor, and also provides better matching of the impedance of the oscillator circuit to the oscillator tube. The smaller reactor made possible by the transformer coupling requires much less power output from the audio amplifier.

The use, in combination, of permanent magnetic bias of the saturable reactor, a center-tapped control winding on the reactor, and a push-pull amplifier driving the control winding, results in improved center frequency stability and amplifier efficiency.

I claim:

1. An oscillator including in combination, an oscillator control circuit including a crystal and a series-resonant circuit portion connected in series with said crystal, said series-resonant circuit portion including reactance means providing resonance in said portion substantially at the series-resonant frequency of said crystal, said reactance means including a saturable reactor having a variable inductance coil on a toroidal core, a U-shaped core having a signal winding thereon for controlling the inductance of said coil, said U-shaped core engaging diametrically opposite points on said toroidal core on one side thereof, said coil having leads for connection to a push-pull signal source and a U-shaped permanent magnet engaging diametrically opposite points on said toroidal core on the side thereof opposite said one side for providing a fixed field therein, and means including an electron device connected to said oscillator control circuit to form a circuit in which oscillations are produced, with the frequency of said oscillations being controlled by the signals applied to said saturable reactor.

2. A frequency modulated oscillator including in combination, an oscillation control circuit including a crystal unit having a series resonant frequency and a series resonant circuit portion connected in series with said crystal unit, said series resonant circuit portion including inductance means and capacitance means providing resonance in said circuit portion substantially at the series resonant frequency of said crystal unit, said inductance means including a transformer having a primary winding and a secondary winding connected in series with said capacitance means, saturable reactor means having a toroidal core and a variable inductance winding thereon connected to said primary winding, said saturable reactor means including a core in magnetic engagement with said toroidal core and having balanced control windings thereon, balanced amplifier means connected to said control windings of said saturable reactor means to apply modulating signals thereto for varying the reactance of said variable inductance winding and thereby varying the inductance of said secondary winding to change the tuning of said series resonant circuit portion, and means including an electron device coupled to said oscillation control circuit to form a circuit in which oscillations are produced, with the frequency of such oscillations being controlled by said modulating signals.

3. An oscillator including in combination, an oscillation control circuit having in series therein first reactance means and switch means for selectively connecting one of a plurality of circuit portions therein, a plurality of circuit portions each including a crystal unit having a series resonant frequency and second reactance means in series therewith, said second reactance means of a connected circuit having a value such that it cooperates with said first reactance means to provide a series resonant circuit resonant substantially at the series resonant frequency of said crystal unit of the connected circuit and in series with said crystal unit, said first reactance means including saturable reactor means having a toroidal core and a variable inductance winding thereon connected in said series resonant circuit, said saturable reactor means including a core in magnetic engagement with said toroidal core and having a control winding thereon, means for applying control signals to said control winding to change the tuning of said series resonant circuit, and means including an electron device coupled to said oscillation control circuit to form a circuit in which oscillations are produced, with the frequency of such oscillations being controlled by the control signals.

References Cited in the file of this patent

UNITED STATES PATENTS

| | | |
|---|---|---|
| 2,382,615 | Donley | Aug. 14, 1945 |
| 2,452,951 | Norgaard | Nov. 2, 1948 |
| 2,575,363 | Simons | Nov. 20, 1951 |
| 2,598,722 | Richards | June 3, 1952 |
| 2,650,350 | Heath | Aug. 25, 1953 |
| 2,703,391 | Gunderson | Mar. 1, 1955 |
| 2,774,873 | Rieke | Dec. 18, 1956 |
| 2,774,943 | Watson | Dec. 18, 1956 |
| 2,814,786 | Naul | Nov. 26, 1957 |
| 2,848,611 | Bousek | Aug. 19, 1958 |

FOREIGN PATENTS

| | | |
|---|---|---|
| 204,903 | Australia | May 10, 1956 |
| 561,993 | Great Britain | June 14, 1944 |